(12) United States Patent
Tang

(10) Patent No.: US 7,287,705 B2
(45) Date of Patent: Oct. 30, 2007

(54) STRUCTURE FOR USB FLASH DRIVE

(76) Inventor: Jiun-Hong Tang, 8F, No. 4, Lane 294, Sec. 2 Jien-Kuo S. Road, Taipei (TW)

( * ) Notice: Subject to any disclaimer, the term of this patent is extended or adjusted under 35 U.S.C. 154(b) by 211 days.

(21) Appl. No.: 11/238,808

(22) Filed: Sep. 29, 2005

(65) Prior Publication Data

US 2007/0069035 A1   Mar. 29, 2007

(51) Int. Cl.
*G06K 19/06* (2006.01)
(52) U.S. Cl. ..................................................... 235/492
(58) Field of Classification Search ................. 235/492
See application file for complete search history.

(56) References Cited

U.S. PATENT DOCUMENTS 7,004,780 B1 *   2/2006   Wang .......................... 439/353
7,092,256 B1 *   8/2006   Salazar et al. .............. 361/737
2005/0036666 A1 *   2/2005   Wang et al. ................. 382/126

* cited by examiner

*Primary Examiner*—Michael G. Lee
*Assistant Examiner*—Tae W. Kim

(57) ABSTRACT

An improved structure for a USB flash drive includes an accommodating base, a circuit board, a sliding seat, a sliding key and a frame body. The circuit board having a connecting terminal on one end thereof and a fingerprint recognizer thereon is inserted into a bottom of the sliding seat for exposing the fingerprint recognizer to a surface of the sliding seat. When in operation, the sliding key is pushed forward to expose the fingerprint recognizer, and further forward movement of the sliding key will cause the sliding seat to move forward to expose the connecting terminal from the accommodating base. When not in operation, the sliding key is pulled rearward to cover the fingerprint recognizer. Further rearward movement of the sliding key will cause the sliding seat to move rearward to retract the connecting terminal in the accommodating base.

4 Claims, 7 Drawing Sheets

STRUCTURE FOR USB FLASH DRIVE

BACKGROUND OF THE INVENTION

1. Field of the Invention

The present invention relates to an improved structure for a USB flash drive. A user can push a sliding key to slide forward by his/her finger, such that a surface of a recognizer and a connecting terminal can be exposed to the outside. On the other hand, when not to be used, the user can pull the sliding key to slide rearward by his/her finger, such that the connecting terminal can be retracted to hide in the USB flash drive, and the sliding key can cover the recognizer. As a result, an improved structure for a USB flash drive with easy operation is obtained.

2. The Prior Arts

In general, since the capacity of conventional 3.5-inch floppy disks is not large, such floppy disks are mainly used to store/access documental files. However, with the convenience of Internet application software, in order to increase the visual and promotional effects, many exhibiters use a lot of electric data files and documents including many tables and image pictures to show various kinds of goods. Since the electric space occupied by each file is very large, which exceeds the capacity of the conventional 3.5-inch floppy disk, the USB flash drive has gradually become a useful and convenient tool for storing/accessing the electric data files.

Since the USB flash drive is small in volume but large in memory capacity, it is very suitable for the users who often travel and carry various data. Further, with the number of users of the USB flash drive is increasing, the price of each USB flash drive is thus greatly decreased, resulting further conformation to the public demands. Therefore, the USB flash drive has become one of the mainstream tools for carrying electric data.

The USB flash drive can be carried to anywhere with the user, and numerous documental data can be stored therein. Further, the operation is very convenient. Although the documental data stored in the USB flash drive can be again accessed from the database in the user's personal computer when losing the USB flash drive, existing USB flash drive still has the following drawbacks: (a) the conventional USB flash drive is not provided with any protective device, if lost, anyone can easily access and read all documents and data stored therein, resulting in divulgence of personal or commercial secrets and serious loss; (b) since the connecting terminal is exposed to the outside when the conventional USB flash drive is not in use, if the connecting terminal is not covered by the covering cap or the covering cap is lost, the connecting terminal may be deformed and damaged when hit the ground. As a result, the user needs to buy an additional one, resulting the waste of money.

Thus, it is desired to overcome the drawbacks of the conventional USB flash drive in terms of structural improvement and measures for keeping secret.

SUMMARY OF THE INVENTION

The object of the present invention is to overcome the drawbacks and technical problems of the conventional USB flash drive in terms of protective structure and means for keeping secret.

In accordance with an aspect of the present invention, there is provided an improved structure for a USB flash drive that comprises an accommodating base, a circuit board, a sliding seat, a sliding key and a frame body. One side face of the accommodating base is provided with an opening. One end of the circuit board is provided with a connecting terminal. The circuit board is provided with a fingerprint recognizer, and is inserted into a bottom of the sliding seat, such that the fingerprint recognizer is exposed to a surface of the sliding seat. Both sides of the sliding seat are inserted into lower sliding grooves provided on inner faces of the frame body, and both sides of the sliding key are inserted into upper sliding grooves provided on inner faces of the frame body. The sliding key is extended downward with a projecting block for being correspondingly inserted into elongated grooves of the sliding seat, such that the projecting block can slide in the elongated groove of the sliding seat. When in operation, the user pushes the sliding key forward (i.e. toward the connecting terminal) by his/her finger to expose the fingerprint recognizer. The further forward movement of the sliding key will also cause the sliding seat to move forward, such that the connecting terminal can be exposed from the accommodating base. When not in operation, the user pulls the sliding key rearward, such that the sliding key covers the fingerprint recognizer. The further rearward movement of the sliding key (i.e., away from the connecting terminal) will also cause the sliding seat to move rearward, such that the connecting terminal can be retracted into the accommodating base.

The main object of the present invention is to provide an improved structure for a USB flash drive. When in operation, the user pushes the sliding key forward (i.e. toward the connecting terminal) by his/her finger to expose the fingerprint recognizer and the connecting terminal. When not in operation, the user pulls the sliding key rearward, such that the sliding key covers the fingerprint recognizer. The further rearward movement of the sliding key (i.e., away from the connecting terminal) will also cause the sliding seat to move rearward, such that the connecting terminal can be retracted into the accommodating base. The operation of the present invention is very natural, smooth and conformable to the habit of humans' action. Further, the present invention is provided with a safe structure for protecting the fingerprint recognizer and the connecting terminal.

Another object of the present invention is to provide an improved structure for a USB flash drive. A locking piece is additionally provided on the sliding key. When the fingerprint recognizer and the connecting terminal are exposed to the outside, the sliding key can be surely locked in position. When the fingerprint recognizer and the connecting terminal are completely retracted, they can be surely protected.

DETAILED DESCRIPTION OF THE PREFERRED EMBODIMENT

Figure 1:
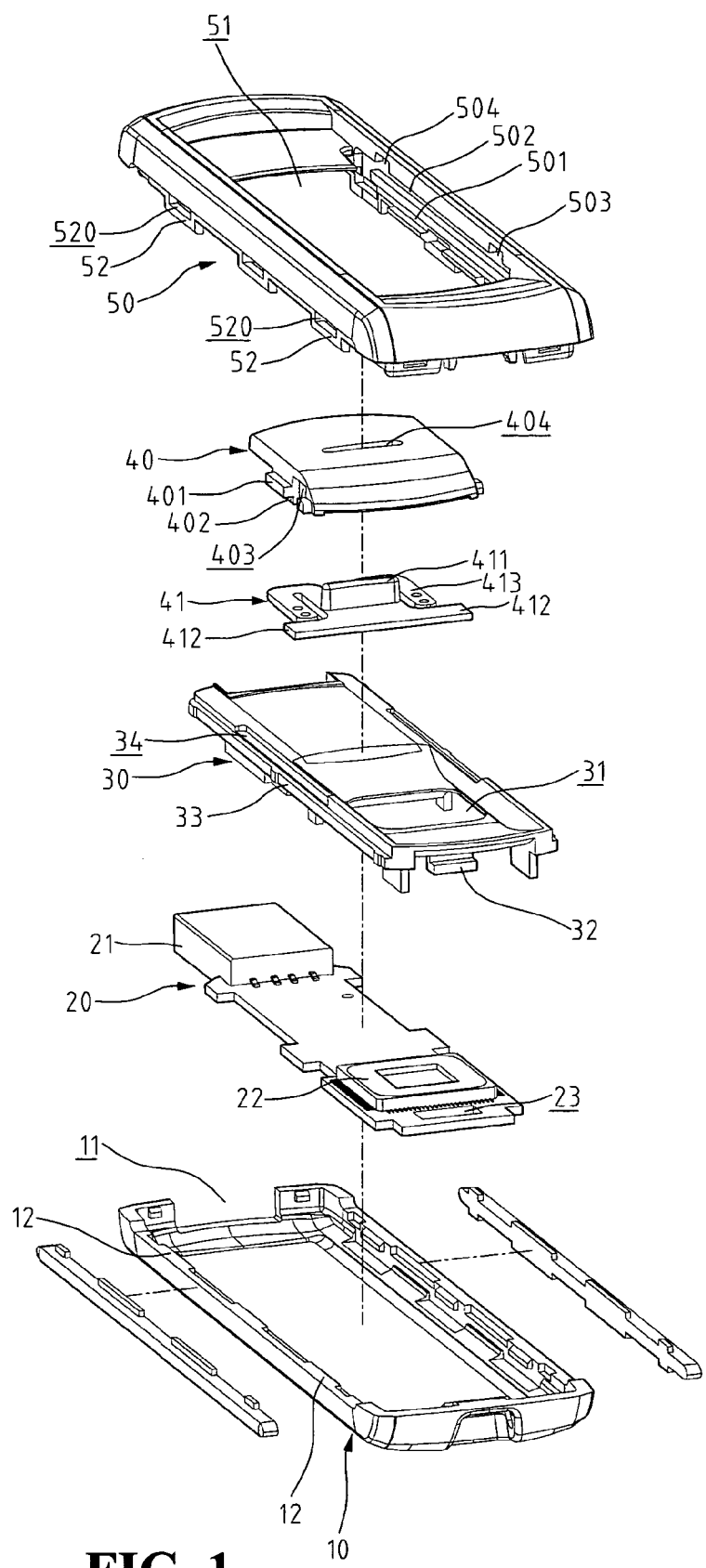
FIG. 1 is a detailedly exploded view showing an embodiment of the present invention.
Figure 2:
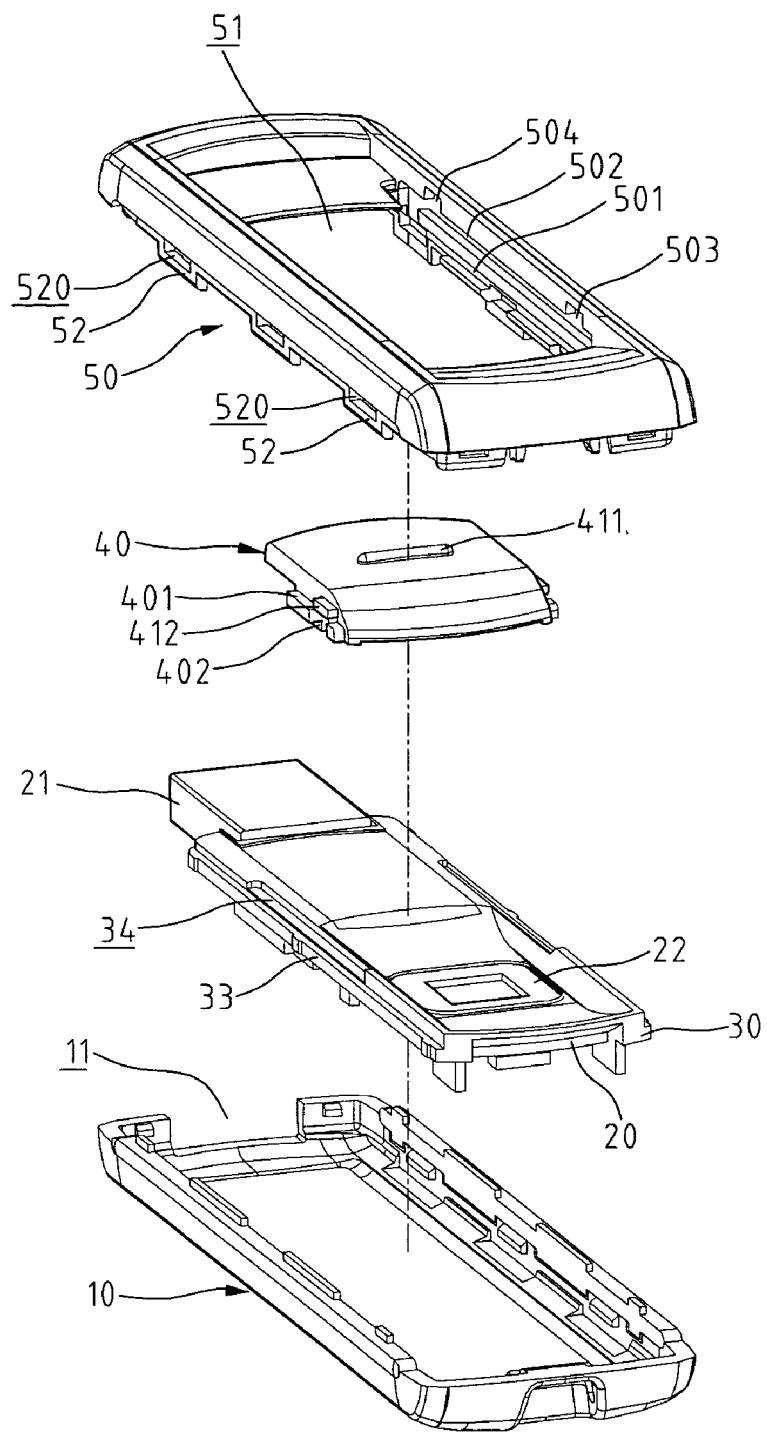
FIG. 2 is an exploded view of the embodiment of the present invention.
Figure 4:
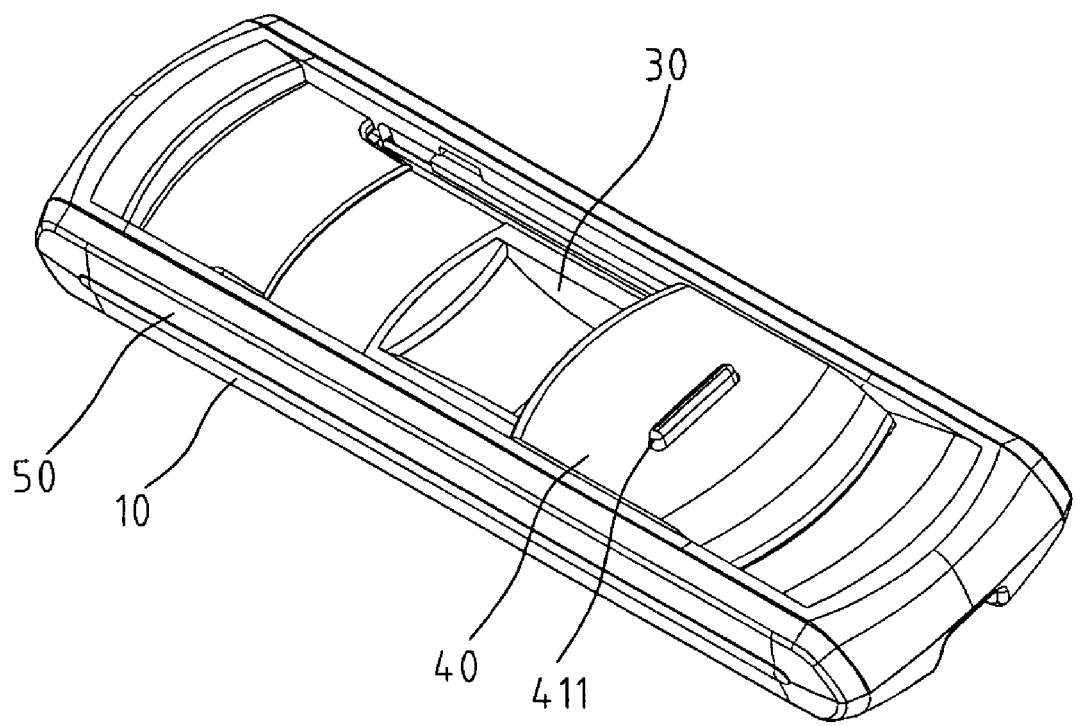
FIG. 4 is a perspective view of the embodiment of the present invention, showing an inactive state in which a sliding cover is pulled toward a bottom thereof and thus covers a fingerprint recognizer, and a connecting terminal is retracted.

Referring to FIGS. 1, 2 and 4, an improved structure for a USB flash drive in accordance with the present invention comprises an accommodating base 10, a circuit board 20, a sliding seat 30, a sliding key 40 and a frame body 50.

One side face of the accommodating base 10 is provided with an opening 11. The inner face of the accommodating base 10 is provided with a plurality of locking pieces 12.

One end of the circuit board is a connecting terminal 21. The circuit board 20 is provided with a fingerprint recognizer 22 and a locking hole 23. The circuit board 20 can be inserted into the bottom of the sliding seat 30, such that the fingerprint recognizer 22 is exposed to the surface of the sliding seat 30.

The sliding seat 30 is provided with an opening 31 corresponding to the fingerprint recognizer 22 of the circuit board 20. The sliding seat 30 is extended downward with a locking hook 32 for correspondingly connecting to the locking hole 23 of the circuit board 20. Both sides of the sliding seat 30 are formed with projecting strips 33. Both sides of the upper surface of the sliding seat 30 are provided with elongated grooves 34.

Both sides of the sliding key 40 are transversely provided with projecting strips 401 and downward provided with a projecting block 403. Further, the surface of the sliding key 40 is provided with an elongated penetrating hole 404.

Figure 3A:
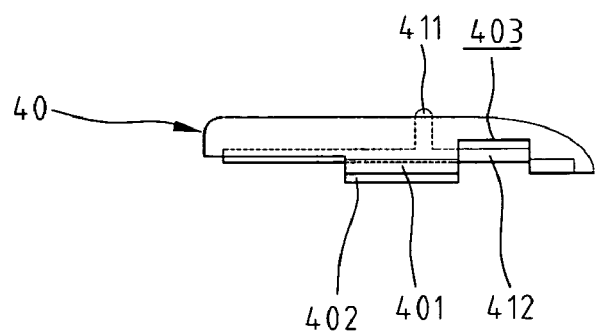
FIG. 3A is a cross-sectional view showing the assembling of a sliding key of the present invention.
Figure 3B:
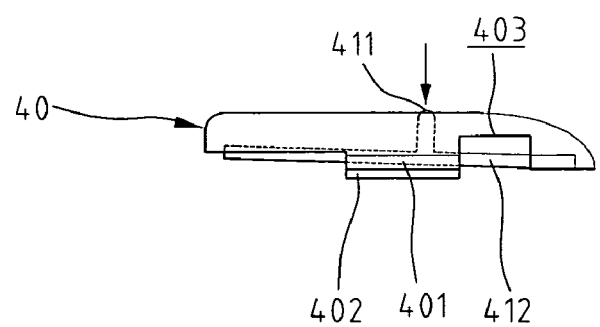
FIG. 3B is a schematic view showing that in FIG. 3A, a projecting piece downward abuts against a locking piece.

The lower side of the sliding key 40 is provided with a locking piece 41. The locking piece 41 is formed as a plate, and provided with a plate-like projecting piece 411 correspondingly projecting from the surface of the penetrating hole 404 of the sliding key 40. Both sides of the locking piece 41 are provided with projecting sheets 412 for being correspondingly inserted into a notch 402 of the sliding key 40. Both sides of the locking piece 41 are formed with U-shaped locking portions 413. The free end of the locking portion 413 is fixed to the lower surface of the sliding key 40, such that the projecting piece 412 of the locking piece 41 has elasticity for moving upward and downward with respect to the locking portion 413. With reference to FIG. 3A, when the projecting piece 412 of the locking piece 41 is not subjected to an external force, it is positioned slightly higher than the projecting strip 401 of the sliding key 40. When the projecting piece 412 of the locking piece 41 is pressed, it can be linearly aligned with the projecting strip 401 of the sliding key 40. At the same time, the projecting piece 412 of the locking piece 41 produces an upward elastic restoring force, as shown in FIG. 3B.

The middle of the frame body 50 is provided with an opening 51. All sides of the frame body 50 are extended downward with a plurality of locking pieces 52. Each locking piece 50 is provided with a locking hole 520 for corresponding to each locking piece 12 of the accommodating base 10. Inner sides of the frame body 50 is provided with a pair of lower sliding groove 501 and a pair of upper sliding groove 502. Both ends of the upper sliding groove 502 are provided with a first positioning notch 503 and a second positioning notch 504, respectively. The projecting strips 33 on both sides of the sliding seat 30 are correspondingly inserted into the lower sliding grooves 501 of the frame body 50, such that the sliding seat 30 can be slide forward and backward within the frame body 50. The projecting strips 401 on both sides of the sliding key 40 are correspondingly inserted into the upper sliding grooves 502 of the frame body 50, such that the sliding key 40 can be slide forward and backward in the opening 51 of the frame body 50.

Figure 5:
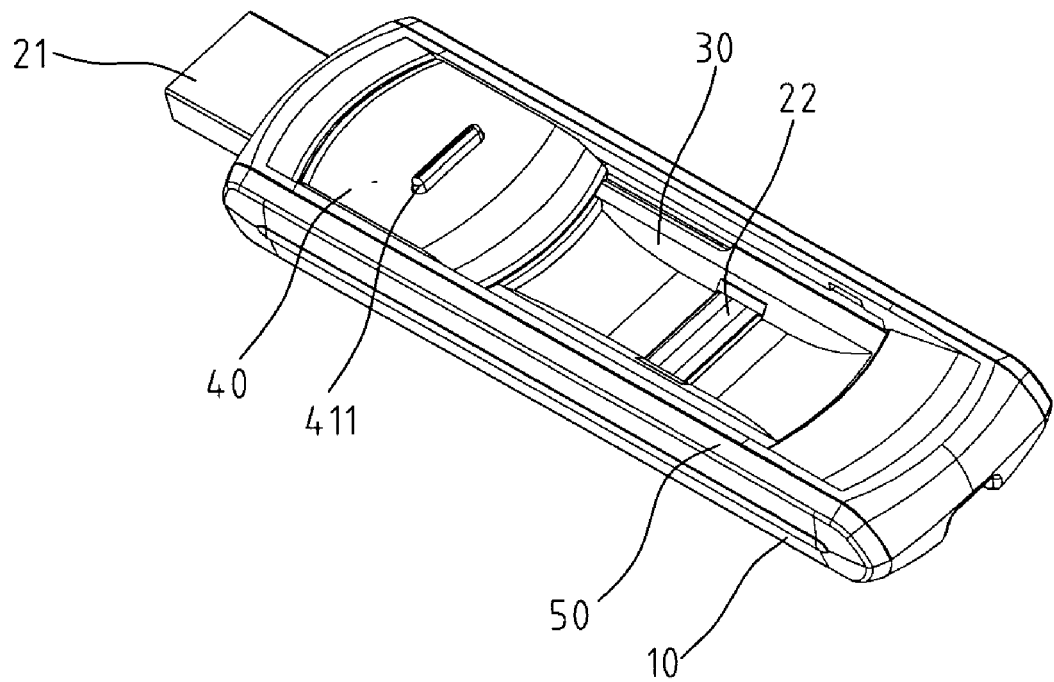
FIG. 5 is a perspective view of the embodiment of the present invention, showing an active state in which the sliding key is pushed to a top thereof to expose the fingerprint recognizer and the connecting terminal.
Figure 6A:
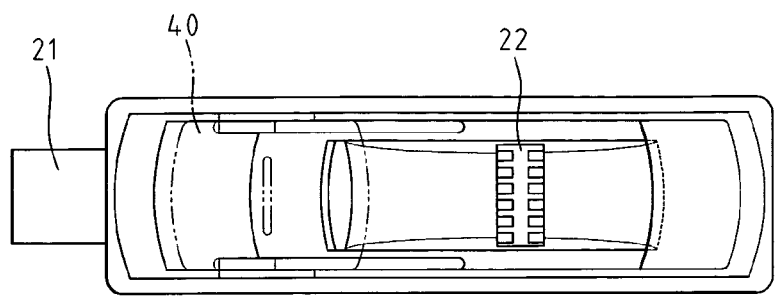
FIGS. 6A, 6B and 6C are schematic views showing actions from the active state in FIG. 5 to the inactive state in FIG. 4.
Figure 6B:
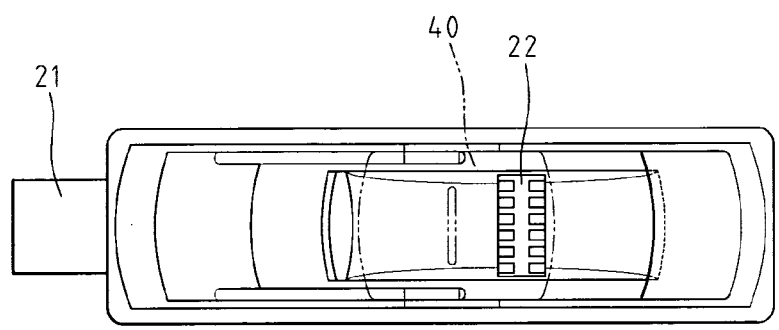
Figure 6C:
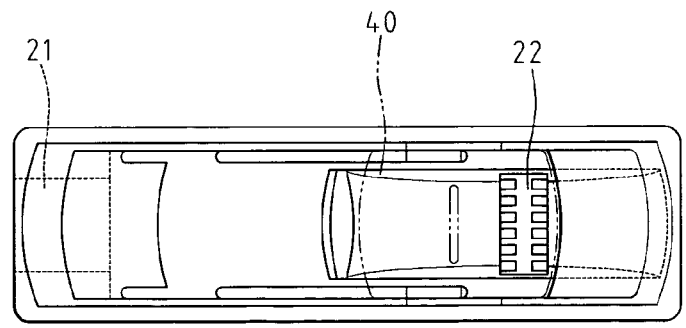

After using, the user needs to protect the USB flash drive from damaging, so he changes the active state shown in FIG. 5 into the inactive state shown in FIG. 4. With reference to FIG. 6A, the user downward presses the projecting piece 411 of the locking piece 41 of the sliding key 40, such that the projecting sheet 412 of the locking piece 41 escapes from the second positioning notch 504 provided on the left side of the upper sliding groove 502 of the frame body 50. The projecting sheet 412 is linearly aligned with the projecting strip 401 of the sliding key 40, as shown in FIG. 3B, such that the locking state of the sliding key 40 is released. The sliding key 40 moves to the right (away from the connecting terminal 21). The sliding key 40 first covers the fingerprint recognizer 22, as shown in FIG. 6B. At this time, the projecting block 402 only slides in the elongated groove 34 of the sliding seat 30 and abuts the left side of the elongated groove 34 without causing the sliding seat 30 to move. The user continues to pull the sliding key 40 to the end of the right, the projecting block 402 of the sliding key 40 causes the sliding seat 30 to move to the right, such that the connecting terminal 21 is completely retracted into the accommodating base 10 and located in position, as shown in FIG. 6C. At this time, the projecting sheet 412 of the locking piece 41 of the sliding key 40 is pushed upward by its elastic restoring force and thus is inserted into the first positioning notch 503 on the right end of the upper sliding groove 502 of the frame body 50. As a result, the sliding key 40 is locked and kept stationary.

Figure 7A:
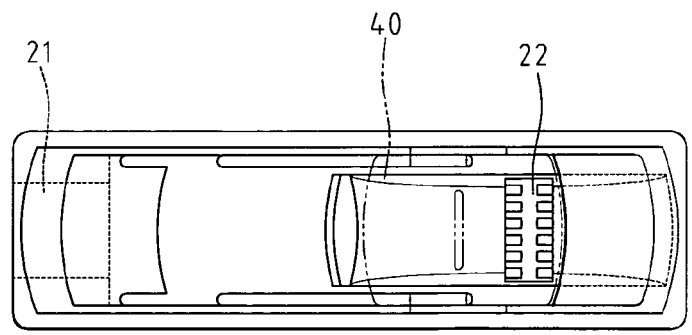
FIGS. 7A, 7B and 7C are schematic views showing actions from the inactive state in FIG. 4 to the active state in FIG. 5.
Figure 7B:
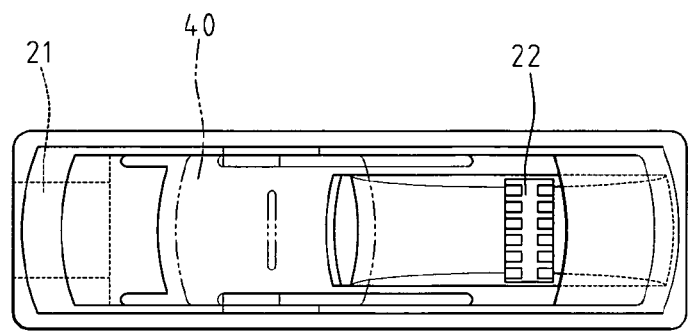
Figure 7C:
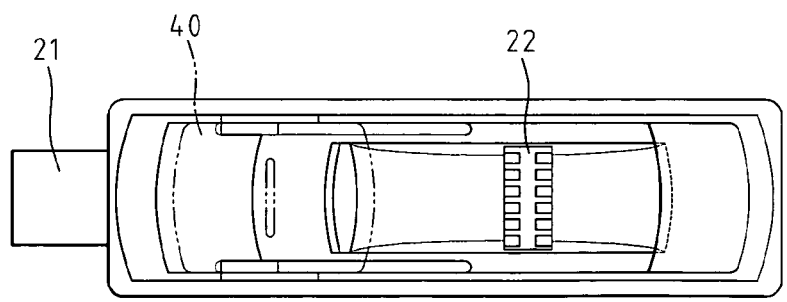

On the other hand, when using, the user needs to change the inactive state shown in FIG. 4 into the active state shown in FIG. 5. With reference to FIG. 7A, the user downward presses the projecting piece 411 of the locking piece 41 of the sliding key 40, such that the projecting sheet 412 of the locking piece 41 escapes from the first positioning notch 503 on the right end of the upper sliding groove 502 of the frame body 50. At this time, the projecting sheet 412 is linearly aligned with the projecting strip 401 of the sliding key 40 to release the locking state of the sliding key 40. The user pushes the sliding key 40 to the left (toward the connecting terminal 21), such that the sliding key 40 first moves and exposes the fingerprint recognizer 22, as shown in FIG. 7B. At this time, the projecting block 402 only slides in the elongated groove 34 of the sliding seat 30 and abuts the left side of the elongated groove 34 without causing the sliding seat 30 to move. The user continues to pull the sliding key 40 to the end of the left, the projecting block 402 of the sliding key 40 causes the sliding seat 30 to move to the left, such that the connecting terminal 21 is completely exposed from the opening 11 of the accommodating base 10 and located in position, as shown in FIG. 7C. At this time, the projecting sheet 412 of the locking piece 41 of the sliding key 40 is inserted into the second positioning notch 504 on the left end of the upper sliding groove 502 of the frame body 50. As a result, the sliding key 40 is locked and kept stationary.

According to the above, the present invention is a novel design in structure, which involves novelty, inventive steps and industrial applicability and thus conforms to the requirements for a utility model patent.

Although the present invention has been described with reference to the preferred embodiment thereof, it will be understood that the invention is not limited to the details thereof. Various equivalent variations and modifications can still be made in view of the teachings in the claims and specification of the present invention. Thus, all such variations and modifications are also embraced within the scope of the invention as defined in the appended claims.

What is claimed is:

1. An improved structure for a USB flash drive, comprising an accommodating base, a circuit board, a sliding seat, a sliding key and a frame body, wherein the accommodating base is provided with an opening;
   one end of the circuit board is provided with a connecting terminal, and the circuit board is provided with a fingerprint recognizer;
   the sliding seat is provided with an opening corresponding to the fingerprint recognizer of the circuit board, and the circuit board is inserted into a bottom of the sliding seat, wherein the fingerprint recognizer is exposed to a surface of the sliding seat;
   both sides of the sliding seat are formed with projecting strips, and both sides of an upper surface of the sliding seat are provided with elongated grooves;
   both sides of the sliding key are transversely provided with projecting strips and downward provided with a projecting block corresponding to the elongated groove on both sides of the sliding seat; and
   a middle of the frame body is provided with an opening, inner sides of the frame body are provided with a pair of lower sliding grooves and a pair of upper sliding grooves, and the projecting strips on both sides of the sliding seat are correspondingly inserted into the lower sliding grooves of the frame body, wherein the sliding seat moves forward and backward within the frame body; and the projecting strips on both sides of the sliding key are correspondingly inserted into the upper sliding grooves, wherein the sliding key slides forward and backward in the opening of the sliding key.

2. The improved structure for a USB flash drive according to claim 1, wherein the inner side faces of the accommodating base are provided with a plurality of locking sheets; and sides of the frame body are provided downward with a plurality of locking sheets for correspondingly locking with the locking sheets of the accommodating base.

3. The improved structure for a USB flash drive according to claim 1, wherein the circuit board is provided with a locking hole; and the sliding seat is downward provided with a locking hook for correspondingly locking with the locking hole of the circuit board.

4. The improved structure for a USB flash drive according to claim 1, wherein
   both ends of the upper sliding groove of the frame body are provided with a first positioning notch and a second positioning notch, respectively;
   a notch is provided adjacent to the projecting block of the sliding key, an elongated penetrating hole is provided on the surface of the sliding key; and the lower side of the sliding key is provided with a locking piece;
   the locking piece is formed as a plate and provided with a plate-like projecting piece corresponding to the penetrating hole of the sliding key; both sides of the locking piece are formed with projecting sheets for being correspondingly inserted into the notch of the sliding key; both sides of the locking piece are formed with U-shaped locking portions, and a free end of the locking portion is fixed to the lower surface of the sliding key, wherein the projecting sheet has elasticity of moving upward and downward with respect to the projecting sheet of the locking piece;
   wherein when the projecting sheet is not subjected to an external force, it is positioned slightly higher than the projecting strip of the sliding key, wherein the projecting sheet of the locking piece is inserted into the first positioning notch or the second positioning notch of the upper sliding groove to fix the sliding key and keep stationary.

* * * * *